United States Patent [19]
Pint et al.

[11] Patent Number: 5,436,676
[45] Date of Patent: Jul. 25, 1995

[54] REMOTE CONTROL UNIT CODE TRANSLATION

[75] Inventors: Charles S. Pint, Evanston; Thomas J. Zato, Inverness, both of Ill.

[73] Assignee: Zenith Electronics Corporation, Glenview, Ill.

[21] Appl. No.: 258,320

[22] Filed: Jun. 10, 1994

[51] Int. Cl.6 ............................................... H04N 5/44
[52] U.S. Cl. ..................................... 348/734; 348/906
[58] Field of Search ............................... 348/734, 906; H04N 5/44, 5/45; 455/151.1, 158.4

[56] References Cited

U.S. PATENT DOCUMENTS

| | | | |
|---|---|---|---|
| 5,237,417 | 8/1993 | Hayashi et al. | 348/734 |
| 5,253,066 | 10/1993 | Vogel | 348/734 |
| 5,313,282 | 5/1994 | Hayashi | 348/734 |

*Primary Examiner*—Victor R. Kostak
*Assistant Examiner*—Nathan J. Flynn
*Attorney, Agent, or Firm*—Roland W. Norris

[57] ABSTRACT

A television display system having a remote control unit which sends different command codes, upon activation of the same button, dependent upon which mode the remote control unit is in; has a simplified operation by translating a noneffective command code from the transmitter into an effective command at the display unit when the display unit is not in a signal source which can act upon the noneffective command code. Further simplifying the keypad operation of the remote control transmitter by allowing function and adjustment keys to perform double duty depending on the operating mode of the display is also discussed.

5 Claims, 3 Drawing Sheets

REMOTE CONTROL UNIT CODE TRANSLATION

BACKGROUND OF THE INVENTION

1. Field of the Invention

The present invention relates to television, or other audio-visual type display systems having remote control transmitters wherein the display unit and the transmitter both having multiple operating modes; and means for simplifying the operation of the display unit through the remote control keypad.

2. Discussion of the Related Art

Recently an interactive on-screen program guide, which is updated by broadcast transmissions and stored in the broadcast receiver, has become a reality. One such on-screen program guide is STARSIGHT (TM). The reader is referred to U.S. Pat. No. 4,706,121 for an exposition of such a system. Basically, program guide data can be broadcast during the vertical blanking interval (VBI) of a regular broadcast and stored in a program guide memory within the receiver. The receiver is generally an audio-visual display unit such as the common television, colloquially referred to as "TV". The viewer can then superimpose the program guide over the regularly displayed programming and select viewing or recording options from the guide. The on-screen programming guide is controlled by a separate microprocessor from that of the TV.

Also, in recent times TVs have increased their amount of signal source input capability so that a variety of signal sources, e.g., antenna, VCR, cable, laser disc, etc. can be operator selected to determine the display on the TV.

Further, the operating parameters of the display unit/TV itself are increasingly controlled by on-screen menus. The numerical keypad has virtually been eliminated from the TV itself and been replaced by a numeric keypad on the remote control transmitter. The remote control transmitter is most often designed to control any of the varieties of the signal source inputs to the TV as mentioned above, as well as the operating parameters of the TV itself. Thus, as the reader is no doubt aware, there can be a great number of buttons on the remote control transmitter.

In order to control the aforementioned on-screen programming guide, as well as the parameters of the display unit itself, the remote control transmitter can have a completely new set of keys to control the on-screen programming guide. This will undesirably increase the number of keys on the remote control transmitter.

Alternatively, the keys presently on the remote control transmitter which are used to control the TV operating parameters can be made to serve double duty through a "mode selection" of the transmitter to enable it to send different codes with the touch of the same button. This enables the remote control transmitter to control various devices which serve as signal sources for the display unit, but the signal source input selected for the TV must be matched to the operating mode of the remote control transmitter to produce the desired display. For example, when the viewer is in the program guide mode on the remote control unit but not on the program guide signal source for the TV, he cannot display the program guide or any other menu until the mode and signal source match.

Thus, whether extra keys are added or mode selection is used for the keys, one is still not able to conveniently control the display unit. Ideally, one should not have to switch remote control transmitter modes when the TV has a known signal source input.

It is, therefore, among the objects of the present invention to provide a remotely controlled TV system which can "translate" an ineffective remote control command in the on-screen program guide transmitter mode to an effective command for the TV in order to simplify remote control operations based upon a determination of the signal source being used to produce the display.

BRIEF DESCRIPTION OF THE DRAWINGS

Other attendant advantages will be more readily appreciated as the invention becomes better understood by reference to the following detailed description and compared in connection with the accompanying drawings in which like reference numerals designate like parts throughout the figures. It will be appreciated that the drawings may be exaggerated for explanatory purposes.

DETAILED DESCRIPTION OF THE PREFERRED EMBODIMENT

Figure 1:
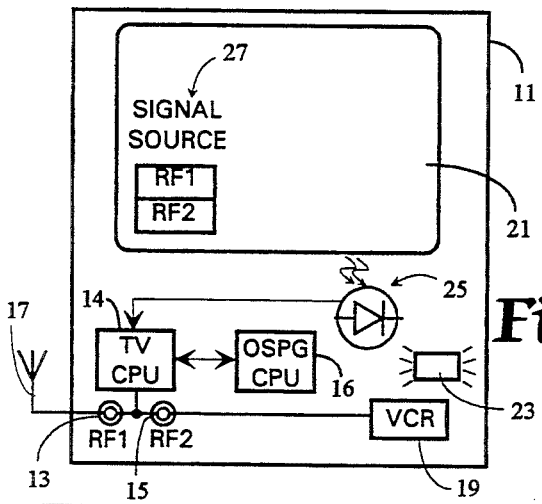
FIG. 1 is a schematic representation of an audio-visual display system according to the present invention.

As seen in FIG. 1, an audio-visual display unit or TV 11 has multiple signal source input jacks represented by a first signal source input 13 and second signal source input 15, which are often labeled in the industry as RF1 and RF2, respectively. The TV 11 is controlled by its microprocessor 14 while the on-screen program guide feature is controlled by its own microprocessor 16. The artisan will realize that the description of these microprocessors as functionally separate does not necessarily mean the components are discrete.

Attached to the first signal source input 13 is an antenna 17 for receiving a broadcast channel with on-screen program guide information contained in the vertical blanking interval (VBI). Attached to the second signal source input 15 is a videocassette recorder, or VCR 19. It will be appreciated by the artisan that any number of signal sources can be fed to the multiplicity of signal source inputs. The TV 11 also has a visual display screen 21 and audio output means or speaker 23 as well as a photodetector 25 for receiving command codes from the remote control transmitter (FIG. 2) in order to affect operation of the TV 11, such as selecting from an on-screen menu 27 which input source to display, as further explained below.

Figure 2:
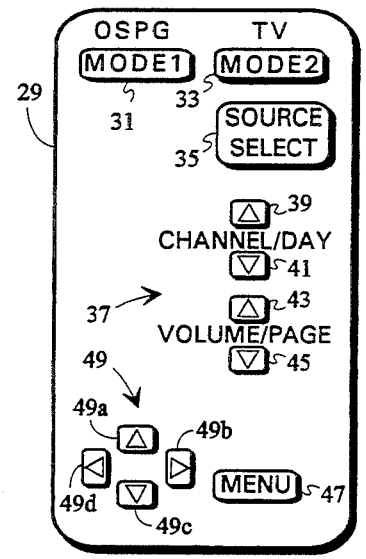
FIG. 2 is a schematic representation of a remote control transmitter according to the present invention.

As seen in FIG. 2, the remote control transmitter 29 contains switches including: first mode selection switch 31 and second mode selection switch 33; a source select switch 35 allowing the operator to select which signal source he would like to have displayed; the so-called "function keys" including channel/day up and down 39, 41, respectively, and the volume/page up and down 43, 45, respectively. A great many keys have not been illustrated on the remote control transmitter in order to simplify the drawing.

Figure 3:
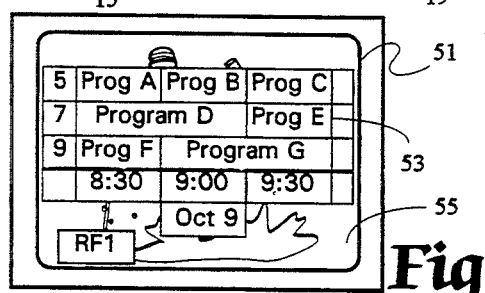
FIG. 3 is a representation of a display on the display unit wherein the signal source of the display unit selected is the first source and the display is of the first type as controlled by the first remote control operating code.

Importantly, for a discussion of the present invention there is also a menu key 47 and its concomitant menu adjustment keys 49. The menu key 47 is necessary to bring up the menus for control of both the operating parameters of the display unit, e.g., ref. no. 27 of FIG. 1, and the menus of the on-screen programming guide 53 as seen in FIG. 3. Operating the menu key 47 on the remote control transmitter 29 will send a different pulse code depending on whether the remote control transmitter 29 is in the first mode for on-screen program guide control or the second mode for display unit control. The transmitter modes are selected by pressing buttons 31 and 33 respectively.

As seen in FIG. 3, a first display type 51 consists of an on-screen program guide 53 superimposed over substantially all of the regular, or entertainment, programming display 55. The on-screen program guide 53 is broadcast during the VBI by the signal source which is picked-up by antenna 17 (FIG. 1). The on-screen program guide signal must be attached to the first signal source input 13 (FIG. 1), or other dedicated signal source input, so that the display unit 11 "knows" which source the on-screen program guide is on.

Figure 3A:
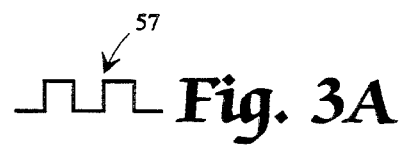
FIG. 3A illustrates the first remote control operating code.

The first display type 51 is made to show the program guide 53 by operating the remote control 29 to select the first signal source input 13 from the on-screen menu 27 (FIG. 1). The transmitter 29 is then put into its first operating mode by pressing button 31, whereby the transmitter will issue the pulse code 57 (FIG. 3A) to activate the on-screen program guide 53 when the menu button 47 is pressed. The on-screen program guide 53 may then be manipulated by the menu adjustment keys 49.

Figure 4:
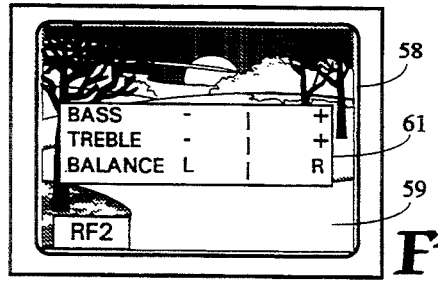
FIG. 4 is a representation of a display on the display unit wherein the signal source selected is the second source, and the display operating mode is of the second type as controlled by the first remote control operating code.

As seen in FIG. 4, the second display type 58 consists of the entertainment programming 59 of the second signal source, 19 of FIG. 1, with a TV operating parameter menu 61, in this case audio, superimposed thereon. As further explained below, according to the present invention, this TV operating parameter menu is called up by the first remote control operation code 57, FIG. 3A, which also activated the first display type 51 (FIG. 3).

Figure 5:
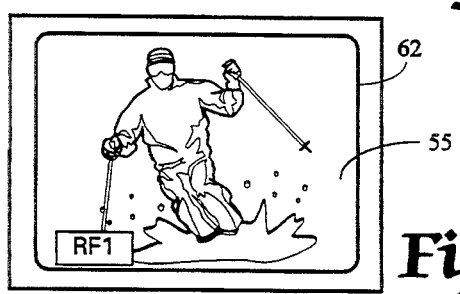
FIG. 5 is a representation of a display on the display unit wherein the signal source selected is the first signal source and the display operating mode is of the third type as controlled by the first or second remote control operating mode.

As seen in FIG. 5, a third display type 62 consists of the regular entertainment display 55 from the first signal source input 13. FIG. 5 is shown as necessary for an explanation of the dual functioning of the function keys 37 (FIG. 2), according to a second aspect of the present invention.

Figure 6:
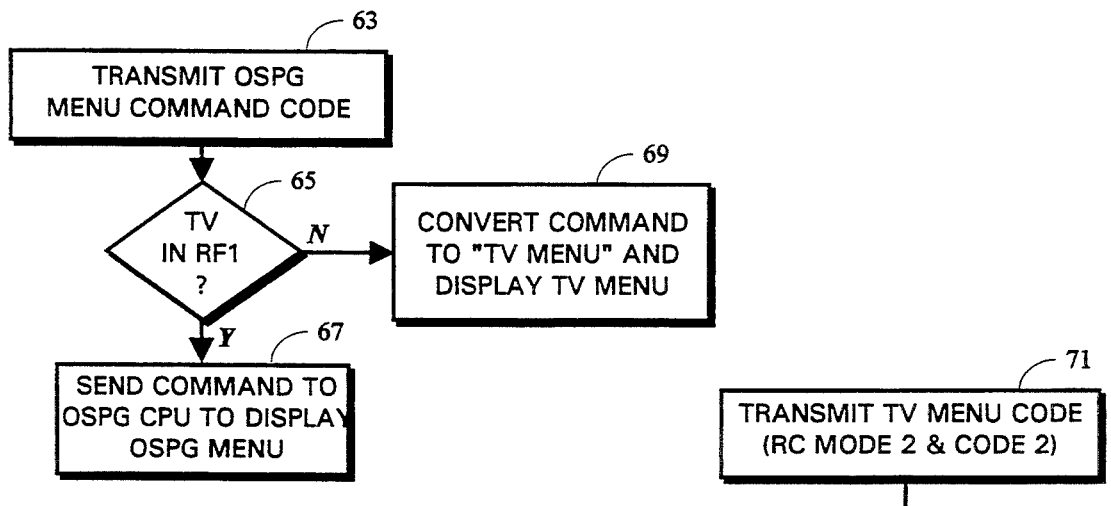
FIGS. 6–10 are flow charts for the logic of the remote control transmitter key pad interaction with the display unit.

Referring to the flow chart of FIG. 6, when the remote control transmitter 29 is in its first mode for commanding the operation of the on-screen program guide 53 (FIG. 3), a press of the menu key 47 will transmit the first remote control operation code 57 (FIG. 3A) to the display unit 11, as at ref. no. 63. The TV will store the command. The microprocessor of the TV will ask if the TV source selection is set for the first signal source input, as at ref. no. 65. It will be recalled that the first signal source, here RF1, is the only signal source which can support the on-screen program guide. If the answer is yes, the TV microprocessor will send the menu command 57 to the on-screen programming guide microprocessor which will then operate, as at ref. no. 67, to display the on-screen program guide menu 53 as per the first display type of FIG. 3. If the inquiry finds that the TV is not currently operating on the first signal source, but with the second signal source 15, i.e. RF2, the television microprocessor will hold the inoperative on-screen program guide menu command 57 and treat it as a command to display the TV operating parameter menu 61, i.e., the second display type of FIG. 4; as at ref. no. 69.

Figure 7:
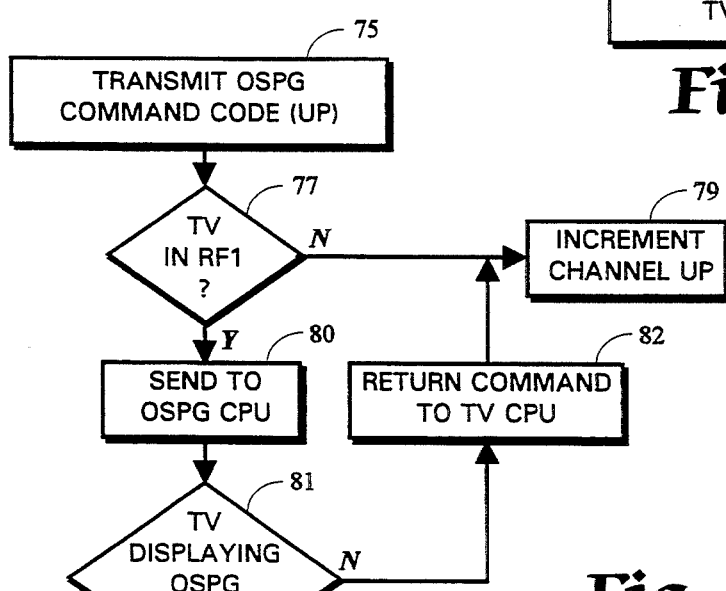

As seen in FIG. 7, when the remote control transmitter is in its second, or TV controlling, mode designed to issue pulse code commands for selection of the TV parameters, a press of the menu button 47 will send a command (not shown) to display the operating parameter menu(s) of the TV, as at ref. no. 71. This command will be received and sent to the TV microprocessor and the operating parameter menus of the TV will be displayed, as at ref. no. 73. This is the second display type 58 as seen in FIG. 4. In either case where the operator has selected a TV signal source not containing the on-screen program guide information, the remote control transmitter menu key will produce a proper TV operating parameter menu regardless of the operating mode of the transmitter.

Figure 8:
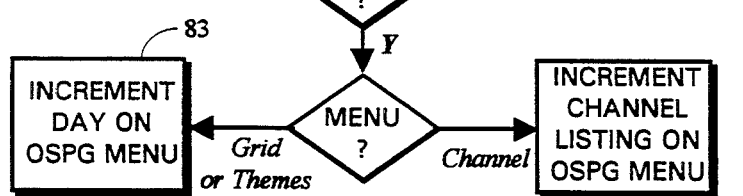

According to a second aspect of the present invention, as seen in the flow chart of FIG. 8, the function keys 37 (FIG. 2) can be made to do double duty without switching the remote control transmitter operating mode. In the first remote control operating mode the channel up and down keys, 39 and 41, also control paging through the on-screen program guide as well as channel selection for individual channel program listings. The volume up/down keys, 43 and 45, also control page forward and back within each day of the program guide. In the second mode, as noted, these function keys are used to adjust the operating parameters, i.e., volume and channel, of the TV. By instituting the recognition subroutine of FIG. 8, the TV microprocessor can learn when the on-screen program guide is active and receive these commands back from the on-screen program guide microprocessor when they are not recognized as commands to manipulate the on-screen program guide.

FIG. 8 shows the logic for the channel/day pair. Depression of the channel/day up arrow key 39 (FIG. 2), with the remote control transmitter in its first mode, causes the remote control transmitter to send its on-screen program guide code command, as at ref. no. 75. Upon receiving this command the TV microprocessor will inquire if the signal source selection is that of RF1, as at ref. no. 77. If not, the TV microprocessor acts to increment the TV channel, as at ref. no. 79. If in RF1, the TV microprocessor sends the command on to the on-screen program guide microprocessor, as at 80. The on-screen program guide microprocessor then inquires whether an on-screen program guide menu is currently displayed, as at ref. no. 81. If not, the command is handed back to the TV microprocessor at 82 and the TV channel is incremented, as at ref. no. 79. If an on-screen program guide menu is being displayed, the command is forwarded to the on-screen program guide microprocessor where the type of menu displayed is determined as at 84. If the menu type contains listings by days, the command is recognized to increment the menu to the next day's program listings, as at ref. no. 83. If the menu is that of an individual channel, the channel listing is incremented, as at 85.

Figure 9:
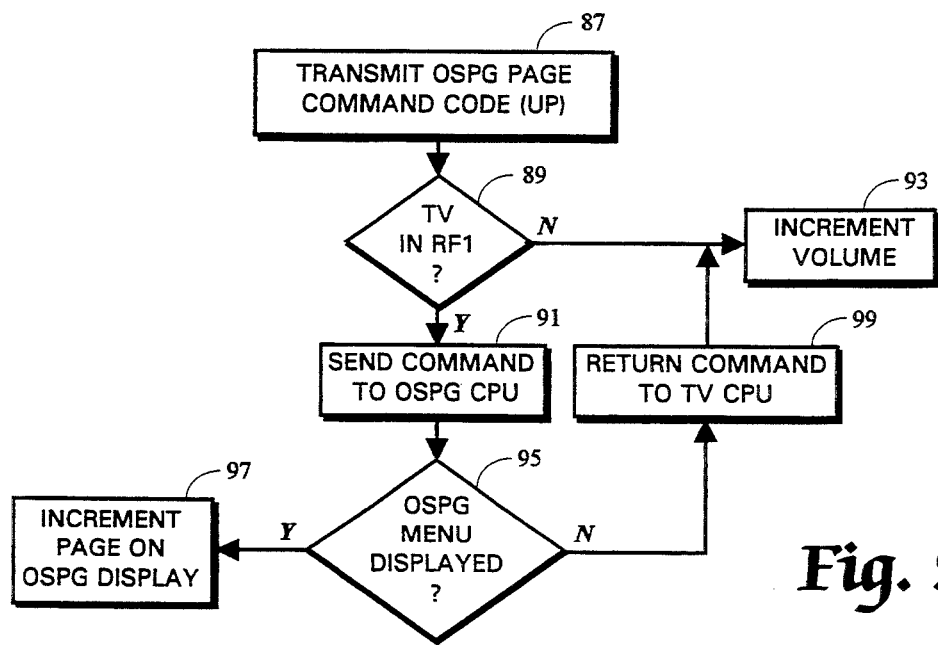

As seen in FIG. 9, the logic for the volume/page function keys is similar to that of the channel/day pair. When the on-screen program guide "page up" command is transmitted 87 the TV microprocessor receives the command and inquires 89 if the signal source is RF1. If yes, the command is passed 91 to the on-screen program guide microprocessor, if no, the TV volume is incremented 93. The on-screen program guide microprocessor then determines 95 whether an on-screen program guide menu is being displayed. If yes, the menu page is incremented 97. If no, the command is passed back 99 to the TV microprocessor and the TV volume is incremented 93.

Figure 10:
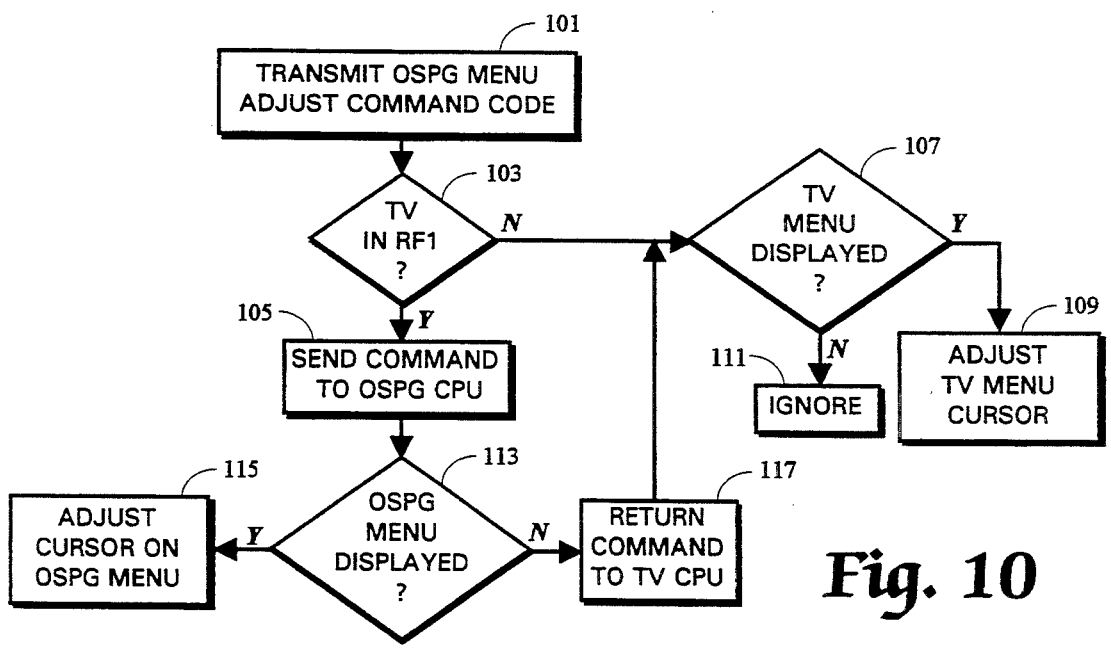

FIG. 10 shows the logic for the menu adjustment keys 49 (FIG. 2) operation which is similar to that of the volume/page pair. When the on-screen program guide menu adjustment command is transmitted 101 the TV microprocessor receives the command and inquires 103 if the signal source is RF1. If yes, the command is transmitted 105 to the on-screen program guide microprocessor. If no, the TV microprocessor inquires 107 if a TV menu is displayed. If yes, the TV menu adjustment is carried out 109. If no, the command is ignored 111. When the on-screen program guide microprocessor receives the menu adjustment command it inquires 113 whether an on-screen program guide menu is being displayed. If yes, the on-screen program guide menu is adjusted 115. If no, the menu adjustment command is passed back 117 to the TV microprocessor for further processing.

While the present invention has been illustrated and described in connection with the preferred embodiments, it is not to be limited to the particular structure shown, because many variations thereof will be evident to one skilled in the art and are intended to be encompassed in the present invention as set forth in the following claims:

Having thus described the invention,
What is claimed is:
1. An audio-visual display system comprising:
  A) a remote control transmitter having means for sending command codes to an audiovisual display unit, including:
    1) first and second remote control operating modes for sending respective first and second remote control command codes to operate an audio-visual display unit;
    2) the first and second command codes being activated by a first single button on the remote control transmitter;
  B) the audio-visual display unit operated by the remote control transmitter, the audio-visual display unit having:
    1) means for receiving and acting upon the first and second remote control command codes sent by the remote control transmitter;
    2) first and second audio-visual display unit display types responsive to the first and second remote control command codes, respectively;
    3) first and second signal source inputs, with the first display type being operable only on the first signal source input;
    4) signal source input source selection means operable to determine the signal displayed; and
    5) translation means for operating the audio visual display unit in its second display type when the remote control transmitter transmits the first remote control command code and the signal source input selected is other than the first signal source input.

2. The display system according to claim 1 wherein the translation means further comprises:
  A) a first microprocessor controlling the first display type;
  B) a second microprocessor controlling the second display type; and
  C) the second microprocessor having means for determining what signal source the display unit is in and, dependent thereupon, either passing the command code to the first microprocessor for execution or retaining the command code and treating it as a second display type command for execution.

3. The display system according to claim 1 further comprising:
  A) third and fourth remote control transmitter command codes activated by a second single button when the remote control transmitter is in the first and second operating modes, respectively;
  B) the third command code controlling a first and second aspect of the first display type;
  C) the fourth command code controlling a first aspect of the third display type;
  D) the third command code further controlling the first aspect of the third display type when the signal source input selected is other than the first signal source input.

4. The display system according to claim 3 further comprising:
  A) fifth and sixth remote control transmitter command codes activated by a third single button when the remote control transmitter is in the first and second operating modes, respectively;
  B) the fifth command code controlling a third aspect of the first display type;
  C) the sixth command code controlling a second aspect of a third display type; and
  D) the fifth command code further controlling the second aspect of the third display type when the signal source input selected is other than the first signal source input.

5. The display system according to claim 4 further comprising:
  A) seventh and eighth remote control transmitter command codes activated by a fourth single button when the remote control transmitter is in the first and second operating modes, respectively;
  B) the seventh command code controlling a fourth aspect of the first display type;
  C) the eighth command code controlling a first aspect of the second display type; and
  D) the seventh command code further controlling the first aspect of the second display type when the signal source input selected is other than the first signal source input.

* * * * *